(12) United States Patent
Cha

(10) Patent No.: US 6,222,789 B1
(45) Date of Patent: Apr. 24, 2001

(54) SUB WORD LINE DRIVING CIRCUIT

(75) Inventor: Jae Yong Cha, Kyoungki-do (KR)

(73) Assignee: Hyundai Electronics Industries Co. Ltd., Kyoungki-do (KR)

( * ) Notice: Subject to any disclaimer, the term of this patent is extended or adjusted under 35 U.S.C. 154(b) by 0 days.

(21) Appl. No.: 09/607,084

(22) Filed: Jun. 28, 2000

(30) Foreign Application Priority Data

Jun. 29, 1999 (KR) .................................................. 99-25224

(51) Int. Cl.[7] ...................................................... G11C 8/00
(52) U.S. Cl. ...................................................... 365/230.06
(58) Field of Search ........................................ 365/230.06

(56) References Cited

U.S. PATENT DOCUMENTS

| | | | |
|---|---|---|---|
| 4,907,200 | 3/1990 | Ikawa et al. | 365/189.09 |
| 5,121,185 | 6/1992 | Tamba et al. | 257/553 |
| 5,253,202 | 10/1993 | Bronner et al. | 365/230.06 |
| 5,610,872 | 3/1997 | Toda | 365/230.06 |
| 5,631,183 | 5/1997 | Kim et al. | 438/239 |
| 5,689,473 | 11/1997 | Toda | 365/230.06 |
| 5,693,540 | 12/1997 | Turner et al. | 437/7 |
| 5,757,716 | 5/1998 | Lee | 365/230.03 |
| 5,781,498 | * 7/1998 | Suh | 365/230.06 |
| 5,835,439 | * 11/1998 | Suh | 365/230.06 |
| 5,862,098 | * 1/1999 | Jeong | 365/230.06 |
| 5,872,742 | 2/1999 | Kengeri et al. | 365/230.06 |
| 5,943,289 | * 8/1999 | Ahn et al. | 365/230.06 |
| 6,069,838 | * 5/2000 | Jeong | 365/230.06 |

FOREIGN PATENT DOCUMENTS 09259968 10/1997 (JP) .

* cited by examiner

*Primary Examiner*—Trong Phan
(74) *Attorney, Agent, or Firm*—Pillsbury Winthrop LLP

(57) ABSTRACT

The present invention relates to a sub word line driving circuit for a semiconductor memory device, and said circuit comprises a first word line driving and clearing means for driving and clearing a first word line by applying according to a first word line driving signal a word line boosting voltage or a ground voltage into the first word line; a first word line potential emitting means for rapidly emitting according to a word line boosting bar voltage an electric potential of the first word line into the ground voltage; a second word line driving and clearing means for driving and clearing a second word line by applying according to a second word line driving signal a word line boosting voltage or a ground voltage into the second word line; a second word line potential emitting means for rapidly emitting according to the word line boosting bar voltage an electric potential of the second word line into the ground voltage; and an equalizing means for equalizing according to the word line boosting bar voltage the first word line and the second word line.

5 Claims, 4 Drawing Sheets

SUB WORD LINE DRIVING CIRCUIT

FIELD OF THE INVENTION

The present invention relates to a sub word line driving circuit of a semiconductor memory device which drives and clears a word line, and more particularly to a sub word line driving circuit characterized in that a word line of on-state is promptly disabled without increasing layout dimension thereby reducing the set-up hold time.

BACKGROUND OF THE INVENTION

Generally a DRAM (Dynamic Random Access Memory) is provided with a plurality of memory cell arrays for storing binary contents, and a decoder for selecting the plurality of memory cell arrays in accordance with address. Each memory cell consists of a capacitor and an MOS transistor. For the MOS transistor in the memory cell, an NMOS transistor that is easy to manufacture and occupies small dimension and does not have burdensome power requirements is frequently used. The NMOS transistor, however, has a shortcoming of losing source voltage as much as its threshold voltage. Further, the memory cell arrays are equipped with word lines to which the NMOS transistors of the plurality of memory cells are commonly contacted. To normal drive the NMOS transistors, those word lines should be supplied with a high-power signal Vpp which is higher than that of the source voltage.

A driving circuit for driving the word line is contacted to the word line of memory cell array and between the decoders, and the driving circuit generates a high-power word line driving signal so as to drive the plurality of memory cells contacted to the word line in accordance with the output of the decoder.

Then, referring to FIG. 1, an architecture and operation of a conventional sub word line driving circuit will be discussed as well as its shortcomings.

The conventional sub word line driving circuit as shown in FIG. 1 consists of a first sub word line driving and clearing circuit part 10 for driving and clearing a first word line, and a second word line driving and clearing circuit part 20 for driving and clearing a second word line.

The first sub word line driving and clearing circuit 10 includes a PMOS transistor P1 for driving word lines, the PMOS transistor P1 applying a word line boosting voltage pxi into a first word line WL01 and activating when a word line driving signal mwl_01 is "low"; a first NMOS transistor N1 for clearing word lines, the NMOS transistor N1 emitting the potential level of the first word line WL01 into a ground voltage Vss and disabling when the word line driving signal mwl_01 is "high"; and a second NMOS transistor N2 for clearing word lines, the second NMOS transistor N2 emitting the potential level of the first word line WL01 into the ground voltage Vss according to a word line boosting bar voltage signal pxib and disabling.

Further, the second word line driving and clearing circuit part 20 includes: a PMOS transistor P2 for driving word lines, the PMOS transistor P2 applying the word line boosting signal pxi into a second word line WL10 and activating when the word line driving signal mwl_01 is "low"; a third NMOS transistor N3 for clearing word lines, the third NMOS transistor N3 emitting the potential level of the second word line WL10 into the ground voltage Vss and disabling when the word line driving signal mwl_10 is "high"; and a fourth NMOS transistor N4 for clearing word lines, the fourth NMOS transistor N4 emitting the potential level of the second word line WL10 into the ground voltage Vss according to the word line boosting bar voltage signal pxib and disabling.

The operation according to the foregoing structure is as follows. The word line driving signal mwl_01 is applied with low potential ("low") below the threshold voltage of the PMOS transistor P1, and then the word line boosting signal pxi is applied through the PMOS transistor P1 to the first word line WL01, thereby activating the first word line WL01.

Meanwhile, the word line driving signal mwl_01 is applied with high potential ("high") beyond the threshold voltage of the NMOS transistor N1 and then the NMOS transistor N1 is turned on, thereby emitting the potential level of the first word line WL01 into the ground voltage Vss. At this time, the NMOS transistor N2 is also turned on when the first word line WL01 is disabled, thereby emitting the potential level of the first word line WL01 into the ground voltage Vss.

Operation of the second word line driving and clearing circuit part 20 is same as that of the first word line driving and clearing circuit part 10.

FIG. 2 is a planar view for showing a layout of a conventional sub word line driving circuit, and FIG. 3 is a layout of an NMOS transistor in the conventional sub word line driving circuit shown in FIG. 1. Herein, the reference "a" is an area being in contact with the first word line, and the reference "b" is an area being in contact with the second word line, the reference "c" is a gate poly 1 area, and the reference "d" is an ISO area.

Referring to the above-described layouts, junctions of the NMOS transistors N1 and N2 are merged at a point and junctions of the NMOS transistors N3 and N4 are merged at a point. And then, gate terminals of the NMOS transistors N2, N4 are merged at the same point since they have the same node.

In order to drive a word line activated as "high" into the disabled "low" state, in the conventional sub word line driving circuit as constituted above, two NMOS transistors N1 and N2 for disabling the word line are turned on and make the word line "low" state. At this time, speed of disabling the word line varies depending on the sizes of the NMOS transistors N1,N2. Therefore, when the NMOS transistors N1 and N2 are increased in their sizes to increase the speed of the word line to be "off" state, the layout dimension of the sub word line is also increased. While the NMOS transistors N1 and N2 are decreased in their sizes to decrease the layout dimension of the NMOS transistors N1 and N2, the speed for disabling the word line is also decreased.

Accordingly, the present invention is provided to solve the foregoing problem and the object of the present invention relates to provide a sub word line driving circuit characterized in that a word line is promptly disabled without increasing layout dimension thereby reducing the set-up hold time.

SUMMARY OF THE INVENTION

To accomplish the foregoing object, the sub word line driving circuit according to the present invention is characterized in that the sub word line driving circuit in a semiconductor memory device includes: a first word line driving and clearing means for driving and clearing a first word line by applying according to a first word line driving signal a word line boosting voltage or a ground voltage into the first word line; a first word line potential emitting means for rapidly emitting according to a word line boosting bar voltage an electric potential of the first word line into the ground voltage; a second word line driving and clearing means for driving and clearing a second word line by applying according to a second word line driving signal a word line boosting voltage or a ground voltage into the second word line; a second word line potential emitting means for rapidly emitting according to the word line boosting bar voltage an electric potential of the second word line into the ground voltage; and an equalizing means for equalizing according to the word line boosting bar voltage the first word line and the second word line.

According to the present invention, the equalizing means is an NMOS transistor.

And then, the first and the second word line driving and clearing means consist of PMOS and NMOS both serially connected between the word line boosting voltage and the ground voltage respectively.

Furthermore, the layout of the first and the second word line potential emitting means is constructed that the drain and the source of the equalizing means are connected in common to the drain and the source of those NMOS transistors of the first and the second word line driving and clearing means, and the gate of the equalizing means is connected in common to the gates of the first and the second word line potential emitting means.

BRIEF DESCRIPTION OF DRAWINGS

Brief descriptions on the drawings are made hereinafter, and components having the same functions are referenced with the same symbols in all drawing sheets.

DESCRIPTION OF THE PREFERRED EMBODIMENT

Referring to the foregoing drawings, more detailed descriptions on the preferred embodiment are now made.

Figure 1:
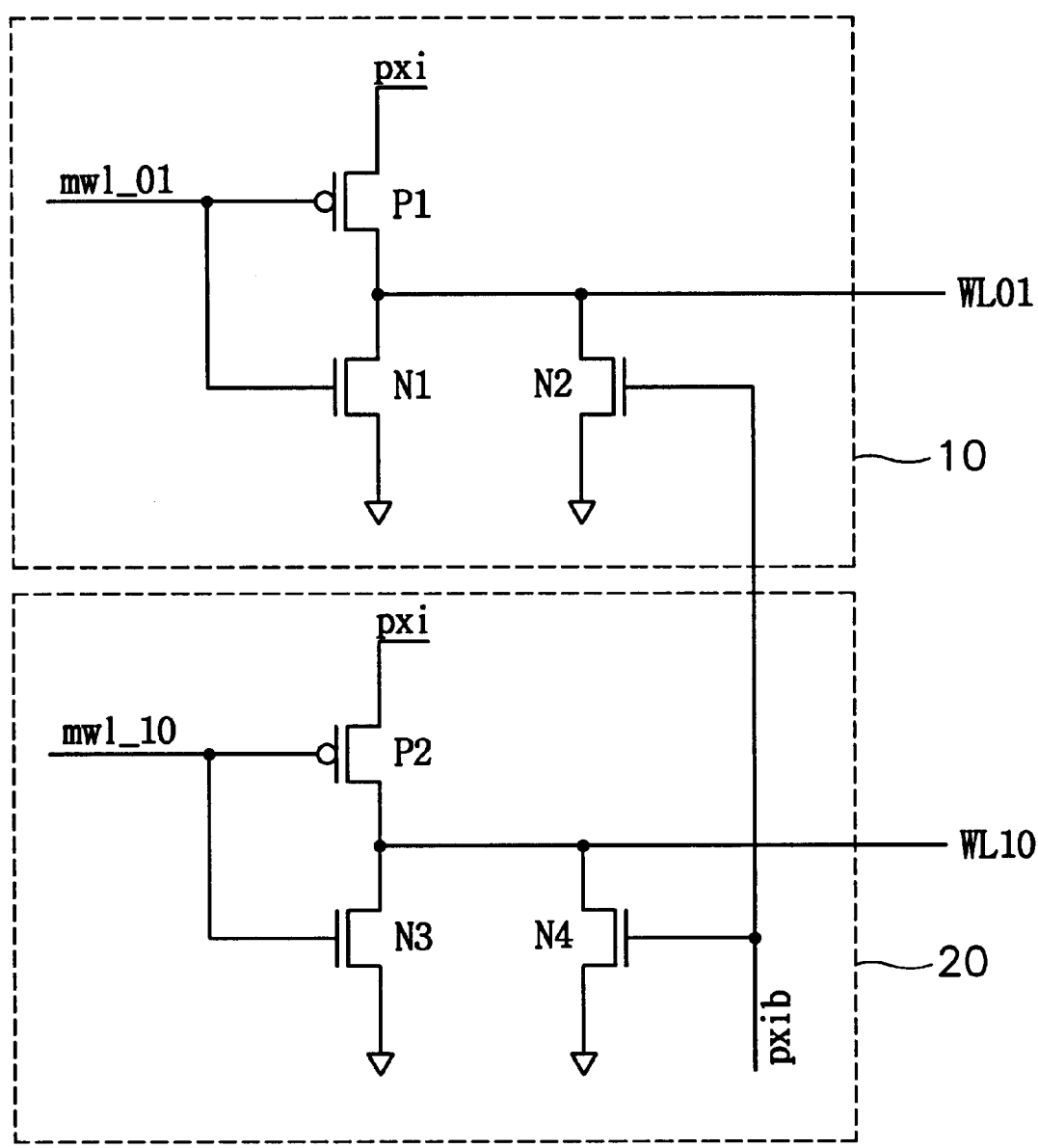
FIG. 1 is a schematic diagram for showing a conventional sub word line driving circuit.
Figure 2:
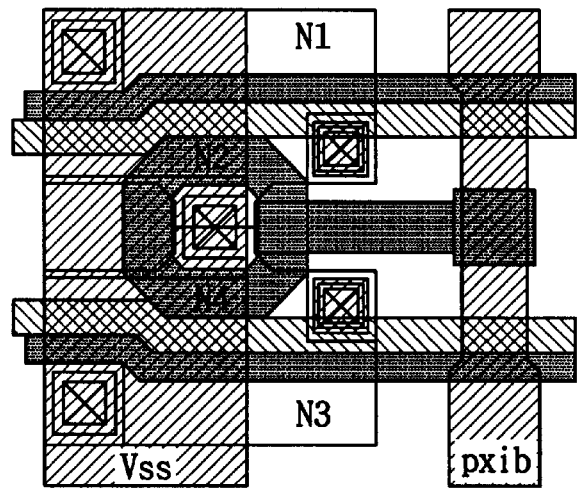
FIG. 2 is a layout of the conventional sub word line driving circuit.
Figure 3:
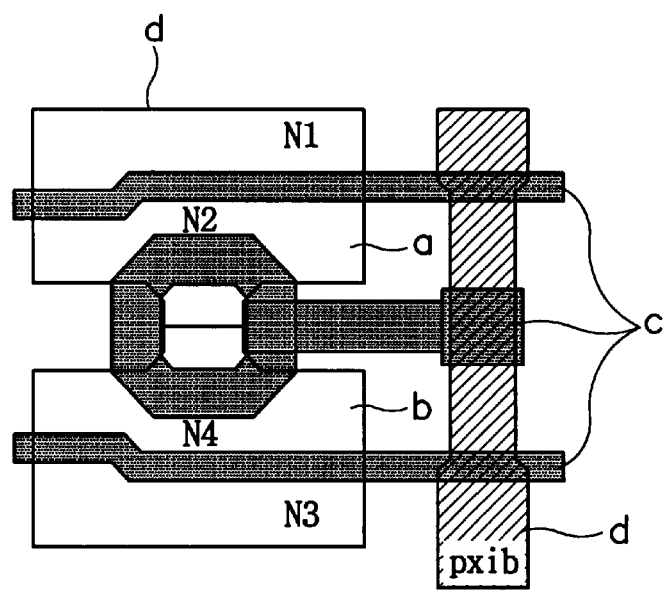
FIG. 3 is a layout of an NMOS transistor of the conventional sub word line driving circuit as illustrated in FIG. 1.
Figure 4:
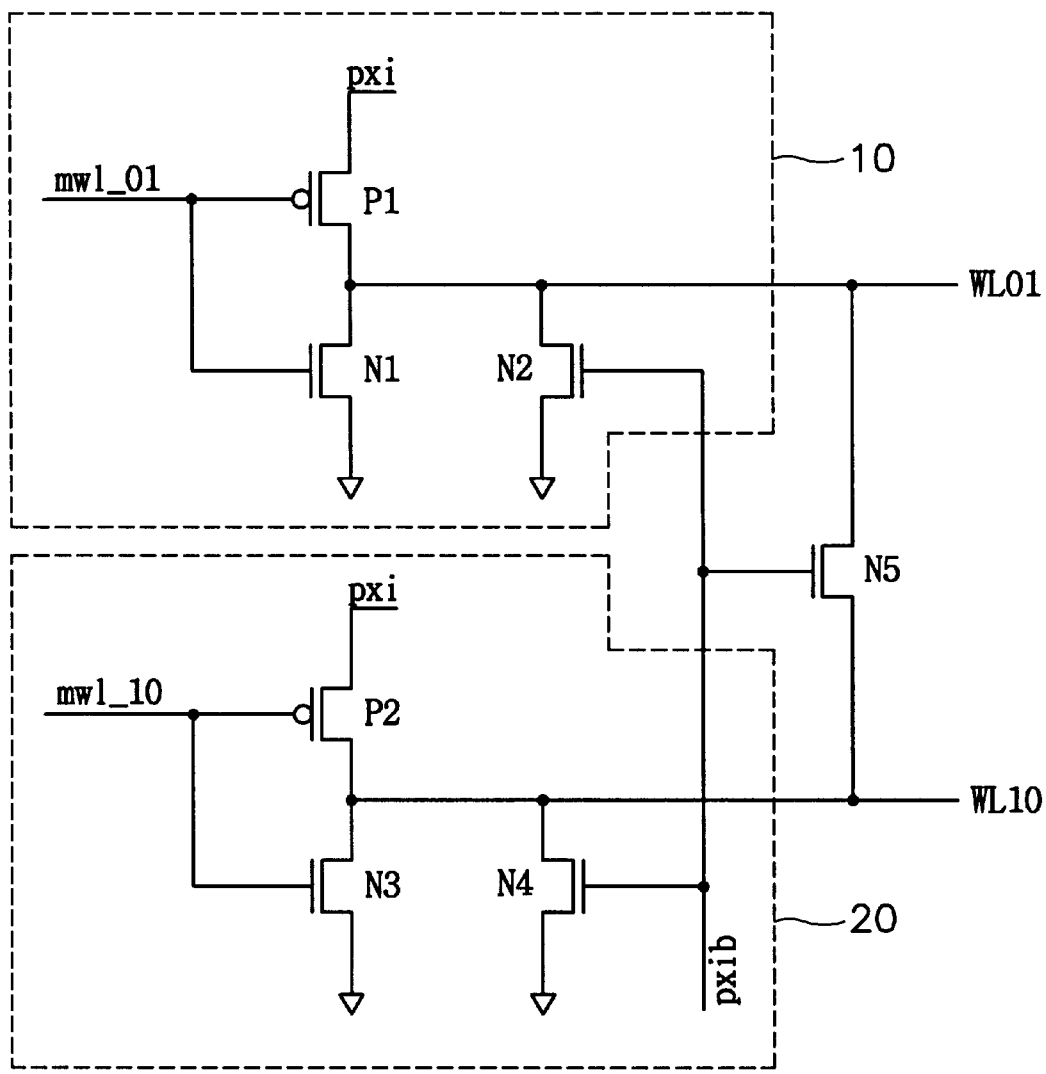
FIG. 4 is a schematic diagram for showing a sub word line driving circuit according to the present invention.

FIG. 4 is a schematic diagram of a sub word line driving circuit according to the present invention, the sub word line driving circuit includes: a first word line driving and clear circuit part 10 for driving and clearing a first word line WL01 by applying according to a first word line driving signal mwl__01 a word line boosting voltage pxi or a ground voltage Vss into the first word line WL01; a first word line potential emitting means N2 for rapidly emitting according to a word line boosting bar voltage pxib the electric potential of the first word line WL01 to the ground voltage Vss; a second word line driving and clearing circuit part 20 for driving and clearing a second word line WL10 by applying according to a second word line driving signal mwl__10 the word line boosting voltage pxi or the ground voltage Vss into the second word line WL10; a second word line potential emitting circuit part 20 for rapidly emitting according to the word line boosting bar voltage pxib the electric potential of the second word line WL10 to the ground voltage Vss; and an equalizing means N5 for equalizing the first word line WL01 and the second word line WL10 according to the word line boosting bar voltage pxib.

Herein, the first word line driving and clearing circuit part 10 consists of a PMOS transistor P1 applying according to the first word line driving signal mwl__01 the word line boosting voltage pxi into the first word line and activating, and an NMOS transistor N1 applying according to the word line driving voltage mwl__01 the ground voltage to the first word line WL01 and disabling.

The second word line driving and clearing circuit part 20 consists of a PMOS transistor P2 applying according to the second word line driving signal mwl__10 the word line boosting voltage pxi to the second word line WL10 and activating, and an NMOS transistor N3 applying according to the second word line driving signal mwl__10 the ground voltage Vss to the second word line WL10 and disabling.

In the first place, when the first word line driving signal mwl__01 is "low", the PMOS transistor P1 of the first word line driving and clearing circuit 10 operates and applies the word line boosting voltage pxi to the first word line WL01 thereby activating the first word line WL01. Meanwhile, when the first word line driving signal mwl-01 is "high", the NMOS transistor N1 of the first word line driving and clearing circuit part 10 operates and emits the voltage level of the first word line WL01 to the ground voltage thereby disabling the first word line WL01.

The first word line potential emitting means N2 is operated to rapidly disable the first word line WL01 in on state when the NMOS transistor N1 of the first word line driving and clearing circuit part 10 is in operation. For this reason, the first word line potential emitting means N2 is driven by the word line boosting bar voltage signal pxib, thereby rapidly emitting together with the NMOS transistor N1 the potential level of the first word line WL01 into the ground voltage Vss.

Similarly, when the second word line driving signal mwl__10 is "low", the PMOS transistor P2 of the second word line driving and clearing circuit part 20 is driven and then the PMS transistor P2 applies the word line boosting voltage pxi to the second word line WL10, thereby activating the second word line WL10. Meanwhile, when the second word line driving signal mwl__10 is "high", the NMOS transistor N3 of the second word line driving and clearing circuit part 20 is driven and then the NMOS transistor N3 emits the voltage level of the second word line WL10 to the ground voltage Vss, thereby disabling the second word line WL01.

The second word line potential emitting means N4 is driven together with the NMOS transistor N3 of the second word line driving and clearing circuit part 20 is driving so that the second word line WL10 is rapidly disabled in the "on" state. For this reason, the second word line potential emitting means N3 operates according to the word line boosting bar voltage signal pxib and functions to rapidly emit together with the NMOS transistor N3 the voltage potential of the second word line WL10 into the ground voltage Vss.

Meanwhile, when the first word line WL01 and the second word line WL10 are disabled, time for disabling the first and the second word lines varies since there is a difference in sizes between the NMOS transistors N1,N2 and N3,NS consisting the first sub word line driving and clearing circuit part 10, and the second word line driving and clearing circuit part 20. To overcome the foregoing problem in the conventional art, the present invention suggests a reduced disabling time by equalizing the first word line WL01 and the second word line WL10 when a disabling signal is applied to the first word line WL01 or the second word line WL10.

Accordingly, a rapid set-up hold time of a word line in this invention can be implemented by emitting the ground voltage Vss of a firstly disabled word line to a secondly driven word line between the first word line WL01 and the second word line WL10.

Figure 5:
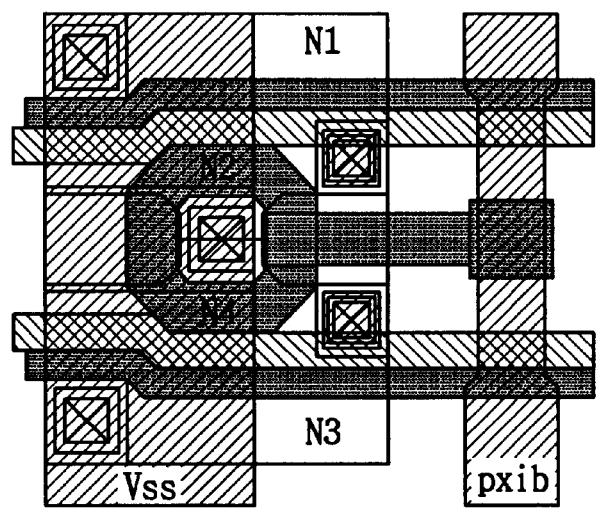
FIG. 5 is a layout of the sub word line driving circuit according to the present invention.
Figure 6:
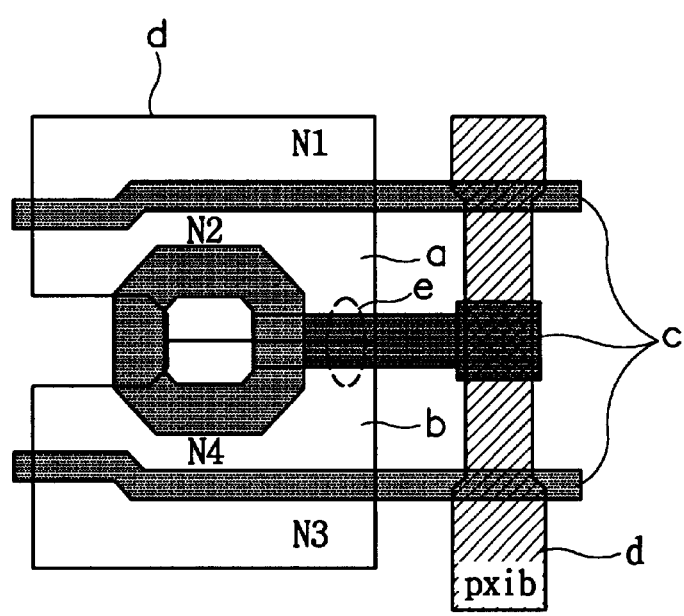
FIG. 6 is a layout of an NMOS transistor used in the present invention so as to promptly make word lines in the off state.

FIG. 5 is a layout of the sub word line driving circuit according to the present invention. FIG. 6 is a layout of an NMOS transistor used in the present invention so as to promptly make word lines in the off state. Herein, the reference symbol "a" is a junction area to which the first word line is contacted, the reference symbol "b" is a junction area to which the second word line is contacted, the reference symbol "c" is a gate poly 1 area, the reference symbol "d" is an ISO area, and the reference symbol "e" is a region of NMOS transistor N5 that is implemented in the present invention.

Referring to FIG. 6, the junction of NMOS transistors N1,N2 is merged at one point as similar to that of the conventional art, and the junction of NMOS transistors N3,N4 is merged again at one point.

To rapidly disable the word line in the "on" state, the NMOS transistor N5 in the present invention uses the junction area of the NMOS transistors N1,N2 as a source and uses the junction area of the NMOS transistors N3,N4 as a drain, and also uses the point where the NMOS transistors N2,N4 are merged as a gate terminal similar in the conventional art.

Accordingly, the NMOS transistor N5 sandwiched between the first word line WL01 and the second word line WL10 can implement a required MOS transistor without increasing layout dimension.

As explained above, the set-up hold time is reduced by rapidly disabling the word line without increasing layout dimension, according to the sub word line driving circuit of the present invention.

Although the preferred embodiment of the present invention has been described and illustrated, various other modifications will be apparent to and can be readily made by those skilled in the art without departing from the scope and spirit of this invention.

What is claimed is:

1. A sub word line driving circuit comprising:
    a first word line driving and clearing means for driving and clearing a first word line by applying according to a first word line driving signal a word line boosting voltage or a ground voltage into the first word line;
    a first word line potential emitting means for rapidly emitting according to a word line boosting bar voltage an electric potential of the first word line into the ground voltage;
    a second word line driving and clearing means for driving and clearing a second word line by applying according to a second word line driving signal a word line boosting voltage or a ground voltage into the second word line;
    a second word line potential emitting means for rapidly emitting according to the word line boosting bar voltage an electric potential of the second word line into the ground voltage; and
    an equalizing means for equalizing according to the word line boosting bar voltage the first word line and the second word line.

2. The circuit of claim 1, wherein the equalizing means is an NMOS transistor.

3. The circuit of claim 1, wherein the first word line driving and clearing means and the second word line driving and clearing means comprise a PMOS transistor that is serially connected between the word line boosting voltage and the ground voltage, and an NMOS transistor respectively.

4. The circuit of claim 1, wherein the first word line potential emitting means and the second word line potential emitting means are constituted by NMOS transistors respectively.

5. The circuit of claim 1 or claim 4, wherein the drain and the source of the equalizing means are connected in common to the drain and the source of NMOS transistors of the first and the second word line driving and clearing means, and the gate of the equalizing means is connected in common to the gates of the first and the second word line potential emitting means.

* * * * *